United States Patent
Masuda et al.

(10) Patent No.: US 7,098,423 B2
(45) Date of Patent: Aug. 29, 2006

(54) LASER MACHINING APPARATUS

(75) Inventors: Mitsuru Masuda, Ebina (JP); Kaoru Matsumura, Ebina (JP)

(73) Assignee: Hitachi Via Mechanics, Ltd., Kanagawa-ken (JP)

( * ) Notice: Subject to any disclaimer, the term of this patent is extended or adjusted under 35 U.S.C. 154(b) by 0 days.

(21) Appl. No.: 11/139,587

(22) Filed: May 31, 2005

(65) Prior Publication Data

US 2005/0263506 A1    Dec. 1, 2005

(30) Foreign Application Priority Data

Jun. 1, 2004   (JP)   ............................. 2004-163694

(51) Int. Cl.
*B23K 26/08*   (2006.01)
*B23K 26/38*   (2006.01)

(52) U.S. Cl. ................................. 219/121.82; 219/121.7
(58) Field of Classification Search ............. 219/121.7, 219/121.82, 121.67
See application file for complete search history.

(56) References Cited

U.S. PATENT DOCUMENTS

| | | | | |
|---|---|---|---|---|
| 4,639,572 A | * | 1/1987 | Gruzman et al. | ...... 219/121.67 |
| 6,040,552 A | * | 3/2000 | Jain et al. | ................. 219/121.7 |
| 6,058,132 A | * | 5/2000 | Iso et al. | ................ 219/121.74 |
| 6,635,849 B1 | * | 10/2003 | Okawa et al. | ............ 219/121.7 |
| 2003/0178398 A1 | * | 9/2003 | Nagatoshi et al. | ........ 219/121.7 |
| 2005/0045606 A1 | * | 3/2005 | Ito et al. | ................. 219/121.82 |

FOREIGN PATENT DOCUMENTS

| | | | | |
|---|---|---|---|---|
| JP | 5-69170 A | * | 3/1993 | |
| JP | 2001-150166 A | * | 6/2001 | |

* cited by examiner

*Primary Examiner*—Geoffrey S. Evans
(74) *Attorney, Agent, or Firm*—Wenderoth, Lind & Ponack, L.L.P.

(57) ABSTRACT

There is provided a printed board machining apparatus having fewer restrictions in terms of the length of printed boards to be machined, that can be readily controlled in positioning a sheet-like workpiece and that is capable of improving the machining efficiency. Plural sets of optical scanners and fθ lenses that compose laser condensing and positioning mechanisms are disposed apart in a width direction (X direction) orthogonal to a longitudinal direction (Y direction) of the sheet-like workpiece and two sheet-like workpieces are fixed on a machining table in parallel, and in the width direction to machine printed boards on the sheet-like workpieces The disposition of the fθ lenses allows the machining of the plurality of lengthy printed boards to be completed practically at the same time or at the same time without limiting the length of the printed boards to be machined.

5 Claims, 4 Drawing Sheets

FIG.3A
FIG.3B
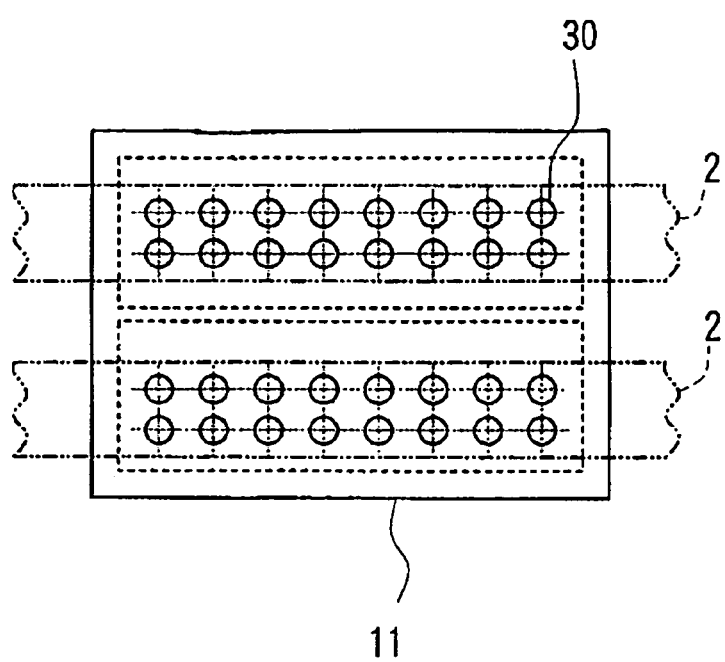
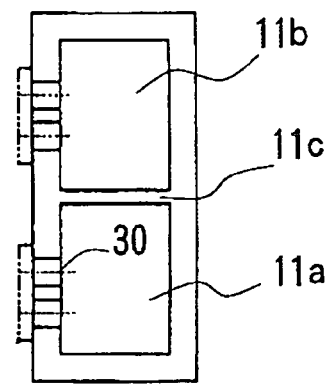

LASER MACHINING APPARATUS

BACKGROUND OF THE INVENTION

1. Field of the Invention

The present invention relates to a laser machining apparatus having a machining table for fixing a part of a sheet-like workpiece thereon and laser condensing and positioning means, such as an fθ lens, for positioning and condensing a laser beam to the sheet-like workpiece to machine the sheet-like workpiece on the machining table by relatively moving the machining table and the laser condensing and positioning means, and when the machining of the workpiece ends, to move the sheet-like workpiece in the longitudinal direction to repeatedly machine a next machining area thereof.

2. Description of Related Art

FIG. 4 is a perspective view of a main part of a conventional laser machining apparatus for machining a sheet-like workpiece 2 while moving it in the longitudinal direction. The sheet-like workpiece 2 is fixed on the XY table 1 by means of a clamper not shown. The sheet-like workpiece 2 is fed from a supply roll not shown disposed on the right side in the figure and is taken up by a take-up roll not shown disposed on the left side in the figure. Printed boards 3, i.e., perspective merchandise, are disposed on the sheet-like workpiece 2 with a pitch of L2 in the Y direction, i.e., in the longitudinal direction (feed direction), of the sheet-like workpiece 2.

Two fθ lenses 4a and 4b for positioning and condensing a laser beam to the workpiece are disposed above the XY table 1. While the fθ lenses 4a and 4b are disposed so that their X-coordinates coincide each other, their interval L1 is adjustable. The sheet-like workpiece 2 is fixed to the XY table 1 such that the center thereof in the width direction coincides with the center axes O1 and O2 of the fθ lenses 4a and 4b.

Next, operations of the conventional laser machining apparatus will be explained. Preceding the machining, the interval L1 between the fθ lenses 4a and 4b is adjusted to an integer times of the pitch of the printed board 3 (one time of an equal pitch in the case shown in the figure).

Then, each area defined by the size of the respective fθ lenses 4a and 4b is drilled by the pulsating laser oscillated from a laser oscillator from the side of points A1 and A2 in FIG. 4 for example. When the machining of the area ends, the XY table 1 is moved in the X-direction to machine a next area to be machined. When the machining in the X-direction ends, the XY table 1 is moved in the Y-direction to machine another area to be machined. This operation is repeated until the machining of the whole printed board 3 ends. When the machining of the printed board 3 ends, the sheet-like workpiece 2 is released and is moved in the Y-direction to position a non-finished printed board 3 in correspondence with the fθ lenses 4a and 4b. This operation is repeated until the sheet-like workpiece 2 is totally taken up.

Because the machining is carried out at two spots on the XY table 1, machining efficiency may be improved in case of the laser machining apparatus described above.

By the way, the size (referred to 'length' hereinafter) in the Y-direction of the printed board 3 disposed on the sheet-like workpiece 2 may differ. Therefore, when the length of one printed board 3 exceeds a half of a moving stroke of the XY table 1, even if the machining of one printed board 3 may be completed, machining of the other printed board 3 cannot be completed. Thus, not only does it become difficult to position the sheet-like workpiece 2 when moving it, but the machining area must also be calculated again every time the sheet-like workpiece 2 is moved. Therefore, it becomes difficult to control the machining.

BRIEF SUMMARY OF THE INVENTION

Accordingly, it is an object of the invention to solve the above-mentioned problems by providing a printed board machining apparatus whose restriction on the length of printed boards to be machined is small, that allows positioning of a sheet-like workpiece to be readily controlled and that is capable of improving the machining efficiency.

In order to solve the above-mentioned problems, there is provided a laser machining apparatus having a machining table for fixing a part of sheet-like workpiece whose one end is taken up by a supply roll and whose other end is taken up by a take-up roll, respectively, and laser condensing and positioning means for positioning and condensing a laser beam to the sheet-like workpiece, and machining the sheet-like workpiece fixed on the machining table by relatively moving the machining table and the laser condensing and positioning means and when the machining ends, by repeatedly moving the sheet-like workpiece in the longitudinal direction to fix a next area to be machined on the machining table, wherein the laser machining apparatus is provided with a plural number of such laser condensing and positioning means, the laser condensing and positioning means are disposed apart in a width direction orthogonal to the longitudinal direction and the plurality of sheet-like workpieces are machined while being fixed on the machining table in parallel with the width direction.

Here, the laser machining apparatus may have two sets of laser condensing and positioning means, may be further provided with laser distributing means for supplying the laser beam outputted from one laser oscillator to either one of the two laser condensing and positioning means and may machine the sheet-like workpiece by the laser supplied via the laser distributing means.

Because the inventive laser machining apparatus is capable of machining the plurality of lengthy printed boards whose length is equal to the moving stroke of the machining table concurrently by the plurality of laser condensing and positioning means, the restriction on the length of the printed board to be machined is small and the positioning of the sheet-like workpieces may be readily controlled. Still more, because the laser machining apparatus allows the number of times of positioning of the sheet-like workpieces on the machining table to be reduced, the machining efficiency may be improved. Furthermore, because the laser machining apparatus does not require changing the interval between the laser condensing and positioning means such as fθ lenses, its arrangement works may be facilitated.

The specific nature of the invention, as well as other objects, uses and advantages thereof, will clearly appear from the following description and from the accompanying drawings wherein the same reference characters denote the same or corresponding parts throughout the several views.

BRIEF DESCRIPTION OF THE DRAWINGS

FIGS. 3A and 3B are structural views of a machining table section of the invention.

DETAILED DESCRIPTION OF THE INVENTION

Figure 1:
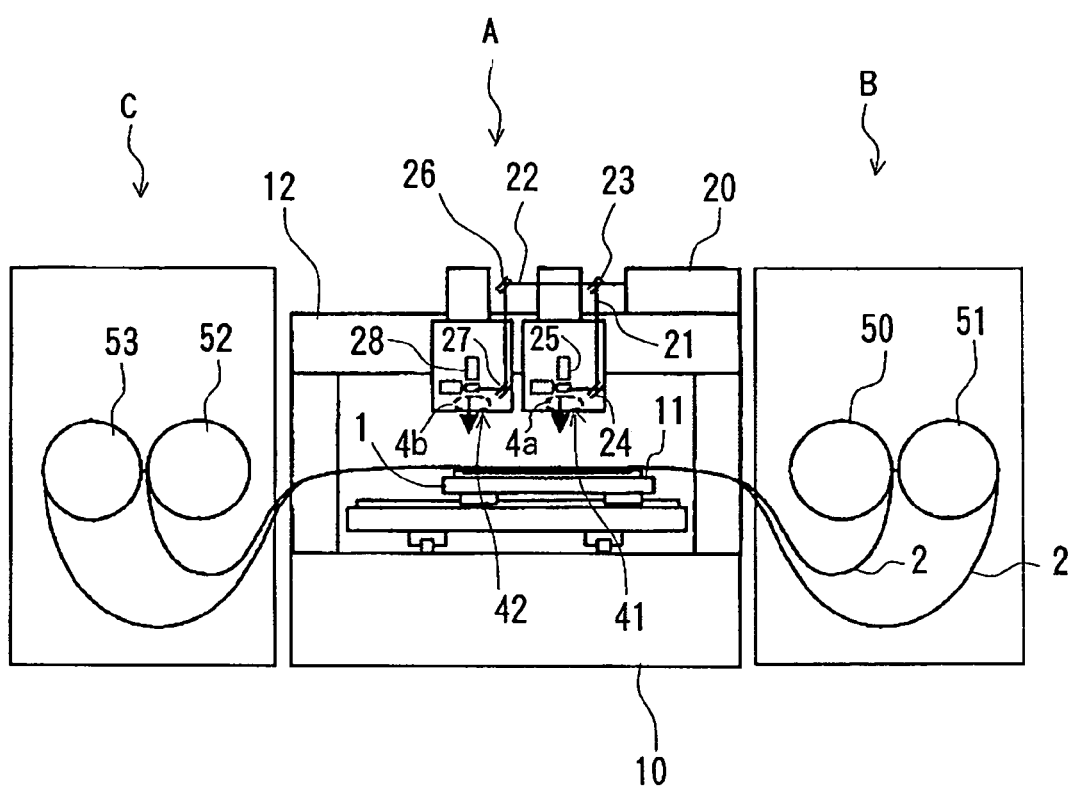
FIG. 1 is a structural view of a laser machining apparatus of the invention.
Figure 2:
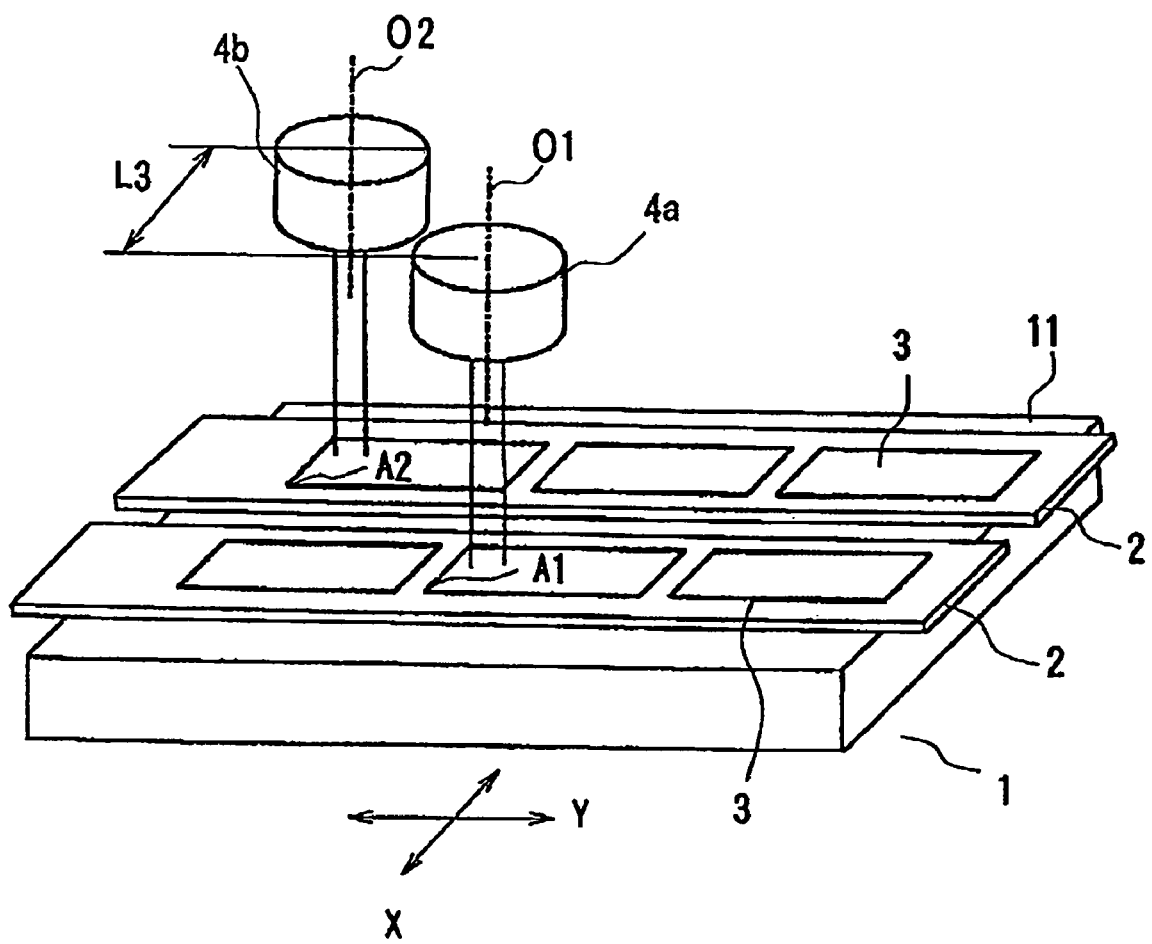
FIG. 2 is a perspective view of a main part of the laser machining apparatus of the invention.
Figure 4:
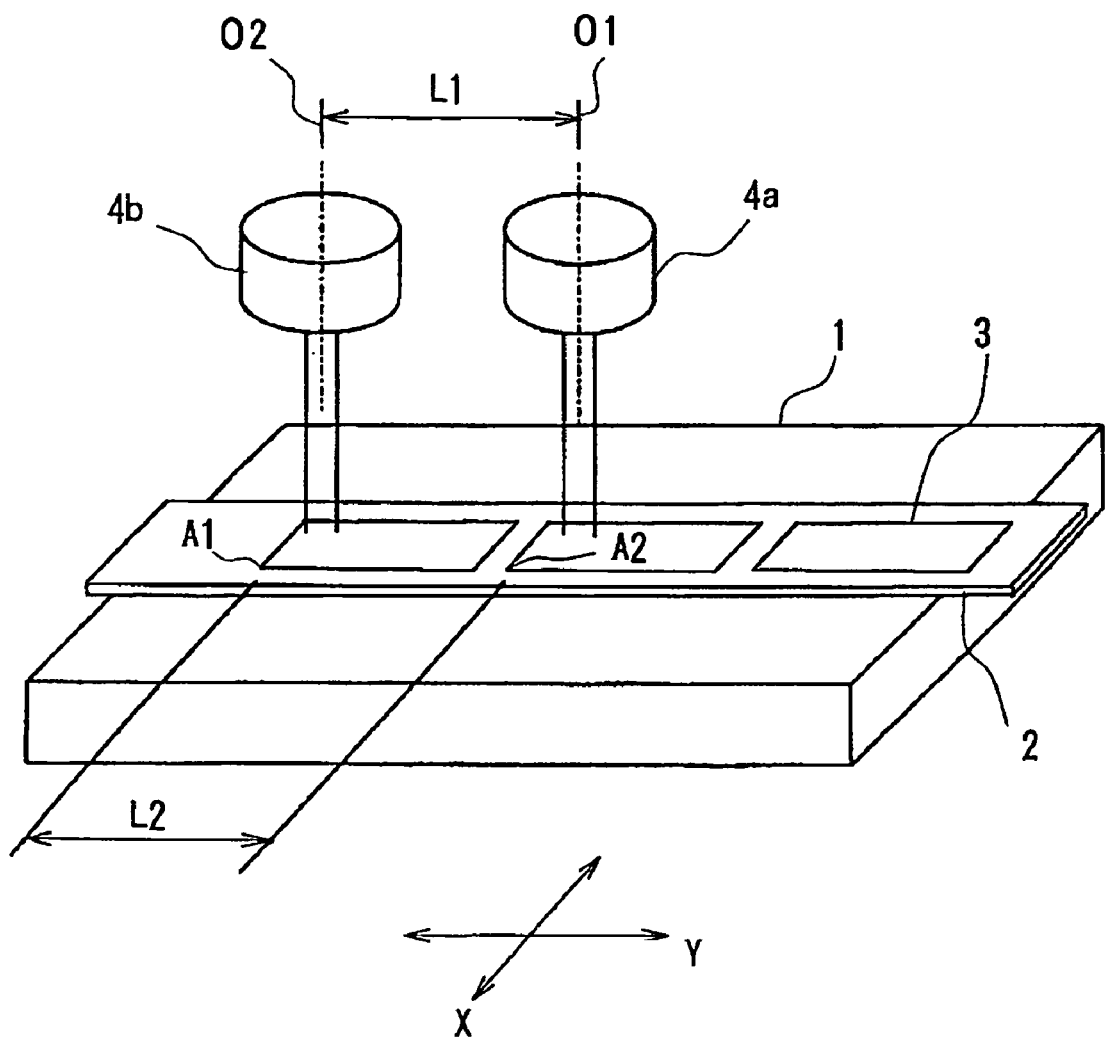
FIG. 4 is a perspective view of a main part of a conventional laser machining apparatus.

FIG. 1 is a structural view of a laser machining apparatus of the invention, FIG. 2 is a perspective view of a main part of the laser machining apparatus of the invention and FIGS. 3A and 3B are structural views of a machining table section, wherein FIG. 3A is a plan view thereof and FIG. 3B is a side section view thereof. The components identical to or having the same function with those in FIG. 4 will be denoted by the same reference characters and their overlapped explanation will be omitted here.

As shown in FIG. 1, an XY table 1 is disposed on a bed 10 of the laser machining apparatus A. The XY table 1 is movable on the bed 10 horizontally in X and Y directions. A machining table 11 is placed on the XY table 1. A gate-type column 12 is fixed to the bed 10 and a laser oscillator 20 is placed on the column 12. An acousto-optic modulator 23 for switching an optical path of a laser to a first optical path 21 or to a second optical path 22 is disposed on an optical axis of the laser oscillator 20. A laser condensing and positioning section 41 composed of a mirror 24, a pair of optical scanners 25 and an fθ lens 4a is disposed on the first optical path 21. A laser condensing and positioning section 42 composed of mirrors 26 and 27, a pair of optical scanners 28 and an fθ lens 4b is disposed on the second optical path 22. It is noted that the optical scanners 25 and 28 and the fθ lenses 4a and 4b position and condense the laser beam on the workpiece 2 on the machining table 11 and compose laser condensing and positioning sections 41 and 42, i.e., the laser condensing and positioning means, respectively.

As shown in FIG. 2, the fθ lenses 4a and 4b are disposed apart in the X-axis direction by a distance L3. It is noted that the distance L3 corresponds to a maximum width of the sheet-like workpiece 2 on which the laser machining apparatus A can machine concurrently. A plurality of holes 30 connected respectively with inner hollow sections 11a and 11b are formed on the surface of the machining table 11 as shown in FIG. 3. The hollow sections 11a and 11b are parted by a wall 11c and are connected respectively with a vacuum source not shown.

A workpiece supplying device B for rotatably supporting two supply rolls 50 and 51 around which non-finished sheet-like workpieces 2 are wound is disposed on one side (on the right side in FIG. 1) of the laser machining apparatus A and a take-up device C for rotatably supporting two take-up rolls 52 and 53 for taking up the sheet-like workpiece 2 whose machining has been finished is disposed on the other side (on the left side of FIG. 1) of the laser machining apparatus A. It is noted that means for conveying the sheet-like workpiece 2 is not shown in the figure because it is a well-known technology.

Next, operations of the invention will be explained. Preceding the machining, one sheet-like workpiece 2 is placed on the machining table 11 so that a center in the width direction thereof coincides with an axis of center O1 of the fθ lens 4a and so that an edge of a first machining area thereof is adjusted to A1. Then the hollow section 11a is vacuumed to fix the sheet-like workpiece on the machining table 11. In the same manner, the other sheet-like workpiece 2 is placed on the machining table 11 so that a center in the width direction thereof coincides with an axis of center O2 of the fθ lens 4b and so that an edge of a first machining area thereof is adjusted to A2. Then the hollow section 11b is vacuumed to fix the sheet-like workpiece 2 on the machining table 11.

Next, machining is started. The laser outputted from the laser oscillator 20 enters either one of the pair of optical scanners 25 and 28 via the mirror 24 or the mirrors 26 and 27 while alternately changing its optical path by means of the acousto-optic modulator 23. The laser beam is then positioned in the X and Y direction and passes through the fθ lens 4a or 4b to machine the printed boards 3, respectively. Accordingly, when two sheet-like workpieces 2 are mounted on the machining table 11, the inventive laser machining apparatus can machine the two sheet-like workpieces practically at the same time. Even if one sheet-like workpiece 2 is mounted on only one side of the machining table 11, the laser machining apparatus can still machine the sheet-like workpiece 2.

When the machining of the area ends, the XY table 1 is moved to machine a next area of the printed board 3 in the same manner with the conventional one. When the machining of a predetermined part of the sheet-like workpieces 2 mounted on the machining table 11 ends, the vacuum is released and a new part to be machined is positioned on the machining table 11.

As described above, the invention allows the same sheet-like workpieces 2 to be machined almost concurrently with one program without being affected by the length of the printed board 3.

It is noted that although the sheet-like workpieces 2 have been fixed by adsorbing to the table in the embodiment described above, they may be fixed by using a mechanical clamping unit. Still more, although the fθ lenses 4a and 4b have been disposed apart in the Y direction, they may be disposed so as to coincide in the Y direction. Further, although one laser beam has been irradiated to the fθ lenses 4a and 4b in the embodiment described above, a plurality of laser beams may be irradiated thereto. It is also noted that although the acousto-optic modulator 23 has been used as the laser distributing means, a beam splitter may be used instead. Still more, the fθ lenses have been used as the laser condensing and positioning means, but the invention is not limited to that and other lenses such as a condenser lens may be used. The number of the laser condensing and positioning means and the workpieces are not limited to be two and may be a plural number such as three or more.

While the preferred embodiment has been described, variations thereto will occur to those skilled in the art within the scope of the present inventive concepts which are delineated by the following claims.

The invention claimed is:

1. A laser machining apparatus comprising:
    a machining table for fixing a part of a first sheet-like workpiece having a first end coupled to a supply roll and a second end coupled to a take-up roll, and for fixing a part of a second sheet-like workpiece having a first end coupled to the supply roll and a second end coupled to the take-up roll;
    a first laser condensing and positioning mechanism operable to position and condense a laser beam to the first sheet-like workpiece; and
    a second laser condensing and positioning mechanism operable to position and condense the laser beam to the second sheet-like workpiece;
    wherein the first sheet-like workpiece and the second sheet-like workpiece fixed on said machining table are machined by relatively moving said machining table and said first and second laser condensing and positioning mechanisms;

wherein, and when the machining ends, the first and second sheet-like workpieces are repeatedly moved in a longitudinal direction to fix a next area to be machined;

wherein said first and second laser condensing and positioning mechanisms are disposed apart from one another in the longitudinal direction and in a width direction orthogonal to the longitudinal direction; and wherein the first and second sheet-like workpieces are machined while being arranged on said machining table next to one another in the width direction and substantially parallel to one another.

2. The laser machining apparatus as set forth in claim 1, further comprising:

a laser oscillator; and a laser distributing mechanism operable to supply the laser beam outputted from said one laser oscillator to either said first laser condensing and positioning mechanism or said second laser condensing and positioning mechanism; and wherein the first sheet-like workpiece and the second sheet-like workpiece are machined by the laser beam supplied via said laser distributing mechanism.

3. The laser machining apparatus as set forth in claim 1, wherein said machining table has a plurality of hollow sections located inside thereof, and wherein said plurality of hollow sections are connected to a vacuum source as well as to a plurality of holes opening to a surface of said machining table so as to enable said first and second sheet-like workpieces to be fixed on said machining table.

4. The laser machining apparatus as set forth in claim 1, wherein said first laser condensing and positioning mechanism comprises a first optical scanner and a first fθ lens, and wherein said second laser condensing and positioning mechanism comprises a second optical scanner and a second fθ lens.

5. The laser machining apparatus as set forth in claim 1, wherein said first laser condensing and positioning mechanism is disposed apart from said second laser condensing and positioning mechanism by a first predetermined distance in the longitudinal direction and by a second predetermined distance in the width direction.

* * * * *